United States Patent [19]

Botti et al.

[11] Patent Number: 4,827,221

[45] Date of Patent: May 2, 1989

[54] INTEGRATED AUDIO AMPLIFIER COMMUTABLE IN A BRIDGE OR STEREO CONFIGURATION IN A SEVEN PIN PACKAGE

[75] Inventors: Edoardo Botti, Mortara; Aldo Torazzina, Monza, both of Italy

[73] Assignee: SGS -Thomson Microelectronics S.p.A., Catania, Italy

[21] Appl. No.: 215,848

[22] Filed: Jul. 6, 1988

[30] Foreign Application Priority Data

Jul. 15, 1987 [IT] Italy ................................ 83641 A/87

[51] Int. Cl.$^4$ .............................................. H03F 3/68
[52] U.S. Cl. ........................................ 330/51; 330/84; 330/146; 330/295; 330/307
[58] Field of Search ............... 330/51, 84, 124 R, 146, 330/262, 271, 295, 307

[56] References Cited

U.S. PATENT DOCUMENTS 4,494,077 1/1985 Fukaya et al. ............... 330/124 R X Primary Examiner—James B. Mullins
Attorney, Agent, or Firm—Pollock, Vande Sande & Priddy

[57] ABSTRACT

An integrated circuit in a seven pin package particularly for audio signal amplification comprises at least two integrated amplifiers selectively commutable in a bridge configuration or in a stereo configuration by means of at least three integrated switches driven by an integrated comparator with threshold set by an internally generated reference voltage and whose input is connected to the SVR pin commonly used to implement the function of common mode signals rejections. The internal commutation between the two selectable configurations is obtained by varying the level of the bias voltage applied to said SVR pin by means of an external voltage divider.

2 Claims, 3 Drawing Sheets

INTEGRATED AUDIO AMPLIFIER COMMUTABLE IN A BRIDGE OR STEREO CONFIGURATION IN A SEVEN PIN PACKAGE

BACKGROUND OF THE INVENTION

1. Field of the invention

The instant invention relates to integrated circuits in general and more in particular to integrated audio amplifiers.

2. Description of the prior art

An ever increasing output power is required from battery operated integrated audio amplifiers (car radios, portable radios and recorders, etc.). This has made popular integrated amplifiers capable of operating in a "bridge" configuration and therefore capable in principle to supply to the loudspeaker of the sound reproduction system a maximum peak voltage equal to twice the value of the supply voltage (battery). However, in case of somewhat lower quality apparatuses the single-ended configuration having an output dynamic equal to the supply voltage is still largely utilized. This configuration permits a reduced power dissipation and a reduced number of amplifying stages.

For obvious reasons, manufacturers of these apparatuses favor integrated devices which from one hand require the smallest number of external components and on the other hand have a small size standard package.

Also for the comprehensible reason of simplifying inventories, manufacturers of these apparatuses favor stocking a single type of integrated circuit capable of being connectable in an external circuit and to operate correctly in a bridge or balanced configuration as well as in a single-ended or stereo configuration.

Nowadays there are many integrated circuits capable of allowing the connection of two monolithically integrated amplifiers present in the chip either in a bridge or stereo configuration. These known devices have notably a rather large package because they need a relatively large number of pins in order to permit the connection in a bridge configuration or in a stereo configuration of the two amplifiers integrated therein by means of an appropriate external circuit of the apparatus. Of course unmodifiable bridge configured and stereo configured integrated circuits are available in small, seven pin, packages.

SUMMARY OF THE INVENTION

The main objective of the present invention is to provide an integrated device comprising two amplifiers, capable of taking a bridge (balanced) or a single-ended (stereo) configuration in a standard seven pin package.

Such an objective is achieved by means of the device of the invention wherein while maintaining two input pins, two output pins, an electrical supply pin and a ground pin, a seventh pin, which is customarily connected through resistances to the inverting inputs and to the noninverting inputs of two amplifiers of the integrated circuit for carrying out the common mode rejection function (referred to as SVR pin), is also utilized to implement the function of automatic commutating said two amplifiers from a bridge configuration to a stereo configuration or vice versa. In other words, while effecting the common mode signals rejection through said seventh pin of the integrated device according to a common technique, by means of the same pin and in function of the level of the voltage applied to such a SVR pin, an automatic commutation of the internal structure of the integrated circuit is performed to convert a stereo (single-ended) configuration of the two amplifiers to a bridge (balanced) configuration thereof and vice versa. The internal commutation is implemented by means of a comparator having a first input connected to said SVR pin and a second input biased by a constant reference voltage generated in the integrated circuit. The signal generated at the output of said comparator determines the state of at least three integrated switches which suitably modify the integrated circuit by providing to interconnect said two amplifiers in a desired configuration (bridge or stereo).

DESCRIPTION OF THE PREFERRED EMBODIMENT

Figure 1:
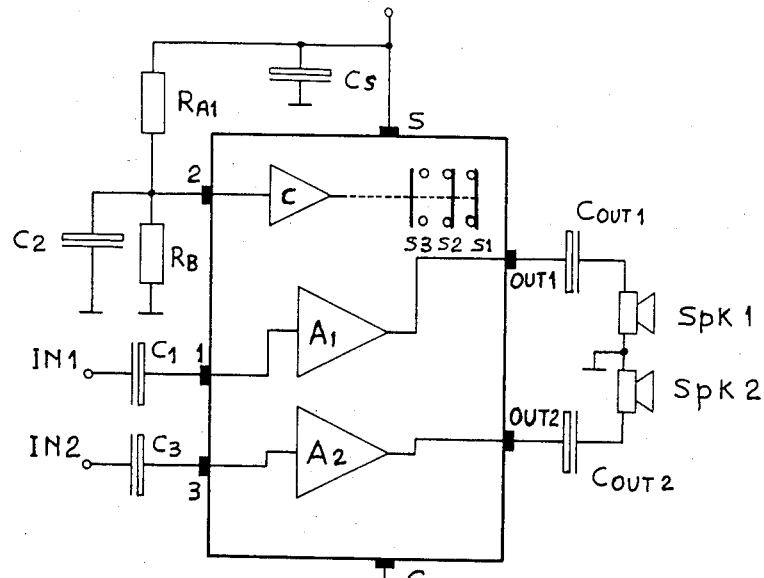
FIG. 1 is a basic block diagram of the device of the present invention showing how the seven pins of the integrated device are connected to an external circuit when the amplifiers of the integrated device are in a stereo or single-ended configuration.
Figure 2:
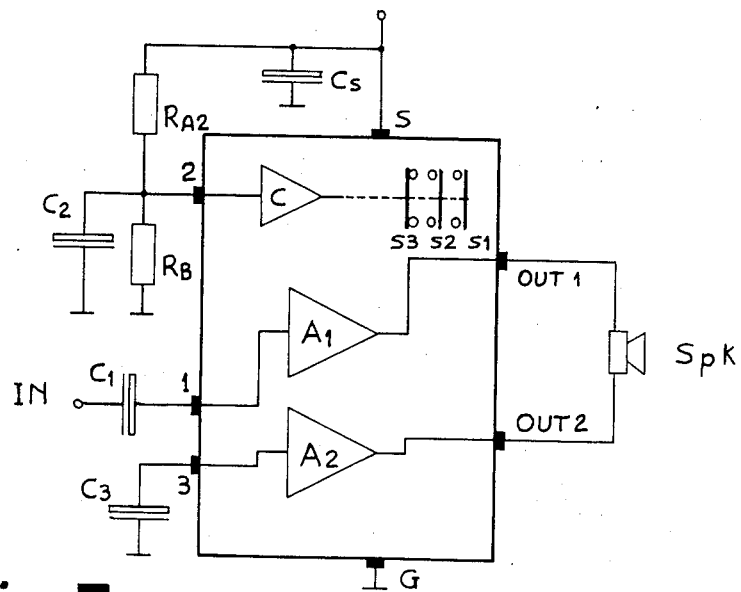
FIG. 2 is a basic block diagram of the device of the invention showing how the seven pins of the device are connected to an external circuit when the two amplifiers are commuted in a bridge or balanced configuration.

With reference to FIGS. 1 and 2, the internal configuration of the two amplifiers A1 and A2 may be modified by varying the value of an external biasing resistor (RA1, RA2), i.e. by varying the ratio between the two resistors RA (1 or 2), and Rb forming a voltage divider connected between the supply rail and ground. This ratio determines the bias voltage applied to the pin 2 of the integrated device (the so-called SVR pin), as it is easily observed in FIGS. 1 and 2. The particular level of the bias voltage applied to the pin 2 of the integrated device causes either a "high" or a "low" state of the output signal of a comparator circuit C. The output signal of the comparator drives the opening or the closing of at least three integrated switches S1, S2 and S3. These two externally selectable states of the comparator C and consequently of the integrated switches S1, S2 and S3 are schematically shown in FIGS. 1 and 2. The way the integrated device is connected externally for implementing a stereo audio amplifier is shown in FIG. 1. The symbols used are those normally used and hardly require a detailed description. As it is easily observed, the two amplifiers A1 and A2, monolithically integrated provide two distinct amplification channels driving two loudspeakers SPK 1 and SPK2 in function of audio signals applied to input terminals IN1 and IN2, which correspond to pins 1 and 3 of the integrated device.

Conversely the external connections of the integrated device for implementing a bridge configuration of the audio amplifier in order to drive a single loudspeaker SPK with a peak voltage which may be twice the value of the supply voltage in function of an audio signal applied to an input terminal IN corresponding to pin 1 of the integrated device are shown in FIG. 2. Also in this case the symbols used are readily comprehended by a skilled technician and no further description is necessary.

Figure 3:
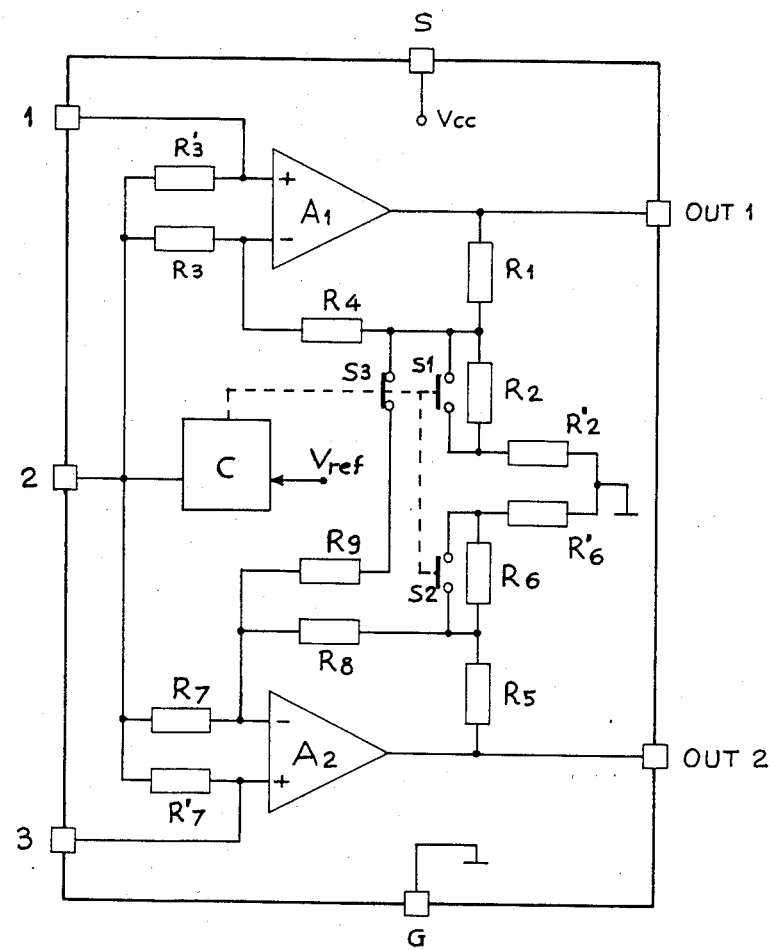
FIG. 3 is a block diagram of the internal structure of the integrated circuit.

The internal structure of the integrated circuit of the present invention is shown in FIG. 3. As it is easily observed, to the pin 2 (SVR) of the integrated circuit, which is customarily connected through resistors R'3, R3, R7 and R'7 respectively to the inverting and to the noninverting inputs of the two integrated amplifiers A1 and A2, is also connected an input terminal of a comparator circuit C whose switching threshold is internally set by means of a constant reference voltage $V_{ref}$.

If the voltage applied to the pin 2 of the device imposed by means of the external voltage divider formed by the two resistors $RA_{(1\ or\ 2)}$ and RB (FIGS. 1 and 2), is less than $V_{ref}$, the output signal of the comparator C determines the following state of the three integrated switches: S3 open, S2 and S1 closed. In this condition, by means of the network formed by the integrated resistors R1, R2, R6, R5, R4 and R8, the internal functional structure of the integrated circuit becomes the one depicted in FIG. 4 corresponding to a stereo (single-ended) configuration of the two integrated amplifiers A1 and A2.

Figure 5:
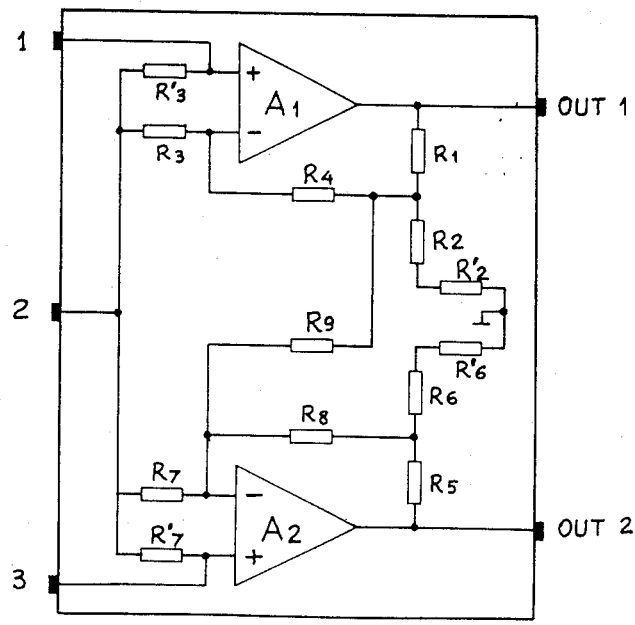
FIG. 5 is a functional block diagram of the integrated circuit of FIG. 3 when in a bridge configuration.

If the voltage applied to the pin 2 of the device is greater than $V_{ref}$, the output signal of the comparator C determines the following state of the integrated switches: S3 closed, S2 and S1 open. In this condition, by means of the network formed by the integrated resistors R1, R2, R2', R6', R6, R5, R4, R9 and R8 an internal functional structure of the integrated circuit corresponding to a bridge (balanced) configuration of the two amplifiers A1 and A2 is determined, as shown in FIG. 5.

Figure 4:
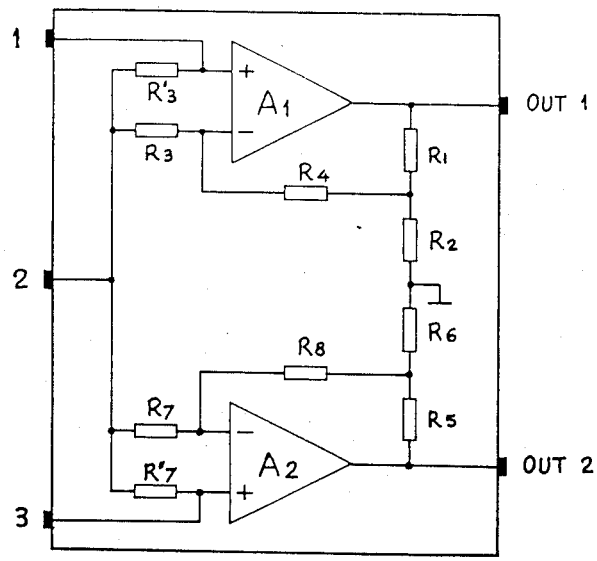
FIG. 4 is a functional block diagram of the integrated circuit of FIG. 3 when in a stereo configuration.

By analyzing the stereo configuration depicted in FIG. 4, the ratio of the pair of resistors R1, R2 and R5, R6 determines the DC gain of the amplifiers A1 and A2. This gain must determine the biasing of the output OUT1 and OUT2 at a voltage equal to one half the supply voltage $V_{CC}$ in order to ensure the largest output voltage swing without clipping.

The DC output voltage $V_{out}$ is tied by such a gain to the bias voltage present on the pin 2 of the device through the following relation:

$$V_{out\ 1} = \frac{V_{pin\ 2}}{R_2} (R1 + R2) = V_{out\ 2} =$$

$$\frac{V_{pin\ 2}}{R_6} (R5 + R6) = \frac{V_{CC}}{2}$$

Stereo signals are applied through the terminals 1 and 3 to the noninverting inputs of the two integrated amplifiers A1 and A2. The AC gain will be determined by the ratios among the resistors R3, R4, R1, R2 for the amplifier A1 and among the resistors R7, R8, R5 and R6 for the amplifier A2, according to common design rules.

The high frequency response may be taylored by means of an external capacitor connected between the pin 2 and an external signal ground; while the low frequency response, i.e. the "closing" of the DC gain, can be effected utilizing the internal ground rail of the integrated circuit according to common practice.

In order to avoid distortion problems caused by residual signals on the internal ground rail of the integrated circuit, it is preferable to reduce as much as possible the DC gain while the high frequency gain, being "closed" on an external signal ground intrinsically "clean", may also take a desirably enhanced value.

By analyzing the bridge configuration depicted in FIG. 5, it is observed that also in this case the DC gain will be determined by the relation:

$$V_{out\ 1} = V_{out\ 2} = \frac{V_{CC}}{2} = \frac{V_{pin\ 2}}{R2 + R2'} (R1 + R2 + R2')$$

It is immediately recognized that the DC gain in this configuration is less than that of the stereo configuration. This because the voltage on the pin 2 necessary to commute the comparator circuit C is greater in the bridge configuration in respect to that of the stereo configuration (of course such a condition may also be reversed).

In this case the audio signal is applied to the noninverting input of the integrated amplifier A1 (pin 1) while the noninverting input of the other integrated amplifier A2 (pin 3) is suitably closed to ground by means of an external capacitor (C3 in FIG. 2). The signal applied to the input is amplified by A1 by a value determined by the value of the feedback network resistors. A portion of this amplified signal is picked-up by means of the resistor R9 and applied to the inverting input of the amplifier A2 which in turn amplifies it and transfers the amplified signal having an inverted phase, to the output terminal OUT2.

The same arrangements for determining the high frequency response of the amplifiers A1 and A2 and the "closing" of the DC gain thereof, which have been indicated for the case of the stereo configuration may also be utilized in the case of a bridge configuration.

Naturally the circuit structure of the comparator C may be any one of the known structures for this type of circuit. Also the integrated switches may be realized in various ways, for example using bipolar transistors, MOS transistors, SCR structures, etc., according to techniques well known to the skilled technician.

The advantages of the integrated device of the present invention may be itemized as follows:

ease of selecting a bridge or a stereo configuration by modification of a single external resistor;

limited number of external components necessary for implementing either one of the two configurations;

small size of the package when the possibility of making such an internally commutable integrated circuit in two functional configurations is exploited in a standard seven pin package;

internal commutation system for the gains and for the structure of the circuit by means of integrated switches driven by a comparator, which is driven by an externally applied bias;

good distortion characteristics notwithstanding the absence of a signal ground pin.

Of course the seven terminal integrated circuit of the present invention may also be mounted in a package having a larger number of pins, the pins in excess remaining unused or being used eventually by another monolithically integrated circuit.

What we claim is:

1. An integrated circuit in a seven pin package comprising at least two distinct audio amplifiers selectively connectable in a bridge or balanced configuration or in a stereo or single-ended configuration and having a first input pin connected to a noninverting input of a first integrated audio amplifier, a second input pin connected to a noninverting input of a second integrated audio amplifier, an electrical supply pin, functionally connected to an external electrical supply source and a ground pin, a first output pin connected to the output of said first integrated audio amplifier, a second output pin connected to the output of said second integrated audio amplifier and an SVR pin connected by means of integrated resistors to the inverting inputs and to the noninverting inputs of said first and second audio amplifiers, a bias voltage derived from said external electrical supply source being applied to said SVR pin for rejecting common mode signals, wherein a comparator circuit integrated therein has a threshold set internally by means of a constant reference voltage generated internally of the integrated circuit and has an input terminal connected to said SVR pin and an output terminal for producing an output signal in function of said bias voltage applied to said SVR pin;

at least three integrated switches are driven by the output signal of said comparator circuit and determine commutation from a bridge configuration of the two audio amplifiers to a stereo configuration thereof and vice versa in function of said bias voltage applied to said SVR pin of the integrated circuit.

2. The integrated device according to claim 1, wherein said two integrated audio amplifiers are connected in a bridge or in a stereo configuration by means of a network of integrated resistors comprising two symmetrical branches each being formed by three resistances connected in series between the output terminal of one and the other respectively of said two amplifiers and the internal ground of the integrated circuit;

the intermediate resistors of said two symmetrical branches of the network being conjunctively short circuited by means of a first and a second switch of said three integrated switches, respectively connected across one and the other of said intermediate resistors of said two symmetrical branches for realizing a stereo configuration;

two feedback resistors respectively connected between the relative inverting input of each amplifier and the node between said intermediate resistor and the resistor connected between the latter and the output of the same amplifier;

a bridge interconnection branch formed by a resistor connected in series with the third of said three integrated switches, a terminal of said branch being connected to the node between the intermediate resistor and the resistor connected between the latter and the output of the integrated audio amplifier to the noninverting input terminal of which is applied a signal to be amplified, and the other terminal of which being connected to the inverting input of the other of said two integrated audio amplifiers;

the state of said first and second switches being opposite to the state of said third switch.

\* \* \* \* \*